(12) United States Patent
Chen

(10) Patent No.: US 10,270,047 B2
(45) Date of Patent: Apr. 23, 2019

(54) FLEXIBLE ORGANIC LIGHT-EMITTING DIODE DISPLAY PANEL

(71) Applicant: Wuhan China Star Optoelectronics Semiconductor Display Technology Co., Ltd., Wuhan (CN)

(72) Inventor: Zhe Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 15/572,798

(22) PCT Filed: Sep. 4, 2017

(86) PCT No.: PCT/CN2017/100346
§ 371 (c)(1),
(2) Date: Nov. 9, 2017

(65) Prior Publication Data
US 2019/0044078 A1 Feb. 7, 2019

(30) Foreign Application Priority Data
Aug. 1, 2017 (CN) .......................... 2017 1 0644819

(51) Int. Cl.
H01L 27/32 (2006.01)
H01L 51/00 (2006.01)
H01L 51/52 (2006.01)
H01L 51/50 (2006.01)

(52) U.S. Cl.
CPC ...... *H01L 51/0097* (2013.01); *H01L 27/3204* (2013.01); *H01L 51/5056* (2013.01); *H01L 51/5206* (2013.01); *H01L 51/5221* (2013.01); *H01L 51/5253* (2013.01)

(58) Field of Classification Search
None
See application file for complete search history.

(56) References Cited

U.S. PATENT DOCUMENTS

| | | | |
|---|---|---|---|
| 2014/0098005 A1* | 4/2014 | Kim ...................... | G06F 3/1446 345/1.3 |
| 2016/0028043 A1* | 1/2016 | Kwon ................. | H01L 51/5253 257/40 |
| 2016/0301032 A1* | 10/2016 | Wang ................... | H01L 51/0034 |
| 2017/0110532 A1* | 4/2017 | Kim ..................... | H01L 51/0017 |

* cited by examiner

Primary Examiner — Cheung Lee

(57) ABSTRACT

The present invention provided a flexible OLED display panel including a flexible substrate, a plurality of OLED devices disposed on the flexible substrate, and a thin-film encapsulating layer disposed on a surface of the OLED devices. The thin-film encapsulating layer includes at least two separate thin-film encapsulating units, the at least two thin-film encapsulating units cover the surface of the OLED devices opposite to the flexible substrate in a form of an one-dimensional array or a two-dimensional array, a gap is formed between edges of two of the thin-film encapsulating units adjacent to each other, and an extension direction of the gap is perpendicular to a bending direction of the flexible OLED display panel.

16 Claims, 3 Drawing Sheets

FLEXIBLE ORGANIC LIGHT-EMITTING DIODE DISPLAY PANEL

RELATED APPLICATIONS

This application is a National Phase of PCT Patent Application No. PCT/CN2017/100346 having International filing date of Sep. 4, 2017, which claims the benefit of priority of Chinese Patent Application No. 201710644819.5, filed on Aug. 1, 2017. The contents of the above applications are all incorporated by reference as fully set forth herein in their entirety.

FIELD AND BACKGROUND OF THE INVENTION

The present invention relates to flexible display technologies, and more particularly to a flexible organic light emitting display panel.

Organic light-emitting diode (OLED) display devices have advantages such as all-solid-state, self-illumination, no backlight, low driving voltage, low energy consumption, fast response, wide operating temperature range, high emission efficiency, wide viewing angle, light weight and thin, and may realize a flexible display characteristic, etc. In recent years, they have become the most promising new display devices.

Using a flexible substrate to manufacture a bendable flexible display is an important development direction of OLED. Since materials of electrodes and luminescent materials of OLED devices are sensitive to oxygen and moisture, oxygen and moisture will cause OLED devices to malfunction. Therefore, effective encapsulating for an OLED display device, so as to fully isolate the functional layers of the OLED devices from moisture, oxygen and other ingredients, may prolong service life of the OLED display device. General technology used in encapsulation of the flexible OLED uses thin film encapsulation (TFE). Thin film encapsulation refers to covering a surface of OLED devices with an entire layer of inorganic film and organic film to compose a thin film encapsulation layer, so that it is difficult for water and oxygen to penetrate inside of OLED devices. However, there is a drawback when using the entire organic layer and inorganic layer to compose a multi-layer barrier structure encapsulation, which the flexibility of the inorganic layer is low, and thus not beneficial to dispersion of mechanical stress. In particular, risk of cracking is prone to occur during curling, folding, or bending (especially curling) for an extended time, resulting in possibility of moisture and oxygen entering into the devices through the crack, causing the OLED display panel to malfunction.

In view of the above, the conventional technology of the flexible OLED display panel uses the entire organic layer and inorganic layer to compose a thin film encapsulation layer for encapsulation. Since the flexibility of the inorganic layer is lower, it will not be beneficial to dispersing mechanical stress. In particular, cracks easily occur during curling, folding, or bending for an extended time, resulting in moisture and oxygen entering into the devices through the crack, causing the OLED display panel to malfunction.

SUMMARY OF THE INVENTION

An object of the present invention is to provide a flexible OLED display panel capable of dispersing the mechanical stress generated during the bending of a flexible OLED display panel, and thus avoid the cracks occurring in the moisture and oxygen barrier material layer of a flexible OLED display panel, so as to ensure the properties of the moisture and oxygen barrier.

In order to solve the above technical problems, the technical solutions provided by the present invention are as follows:

In one embodiment of the present invention, a flexible organic light-emitting diode (OLED) display panel is provided and comprising: a flexible substrate; a plurality of OLED devices disposed on the flexible substrate; and a thin-film encapsulating layer disposed on a surface of the OLED devices; wherein the thin-film encapsulating layer includes at least two separate thin-film encapsulating units, the at least two thin-film encapsulating units cover the surface of the OLED devices opposite to the flexible substrate in a form of an one-dimensional array or a two-dimensional array, a gap is formed between edges of two of the thin-film encapsulating units adjacent to each other, and an extension direction of the gap is perpendicular to a bending direction of the flexible OLED display panel.

According to a preferred embodiment of the present invention, the flexible OLED display panel comprises a display region and a non-display region surrounding the display region; and the thin-film encapsulating layer covers a portion of the OLED devices corresponding to the display region.

According to a preferred embodiment of the present invention, the thin-film encapsulating layer further covers a portion of the OLED devices corresponding to the non-display region.

According to a preferred embodiment of the present invention, the thin-film encapsulating layer is integrally connected with the portion of the OLED devices corresponding to the non-display region.

According to a preferred embodiment of the present invention, the display panel further comprises a polymer layer adhered to a surface of the thin-film encapsulating layer.

According to a preferred embodiment of the present invention, the polymer layer is made of acrylate, fluorine-containing acrylate or acrylamide.

According to a preferred embodiment of the present invention, the at least two thin-film encapsulating units form at least one first row of the thin-film encapsulating units and at least one second row of the thin-film encapsulating units, the first row of the thin-film encapsulating units is adjacent to the second row of the thin-film encapsulating units, and the thin-film encapsulating units in the first row of the thin-film encapsulating units and the thin-film encapsulating units in the second row of the thin-film encapsulating units are alternately arranged in a staggered manner.

According to a preferred embodiment of the present invention, the display panel further comprises a plurality of spacers, the OLED devices adjacent to each other are separated from each other by the spacers, and the gap formed between two of the thin-film encapsulating units adjacent to each other is located at a region of the spacer.

According to a preferred embodiment of the present invention, the OLED devices comprises an anode metal layer, a hole transport layer, an organic light emitting layer, an electron transport layer, and a cathode metal layer stacked in turn, and the cathode metal layer on the surface of the OLED devices is adhered to and covered with a surface of the thin-film encapsulating units.

According to a preferred embodiment of the present invention, the thin-film encapsulating units include a first inorganic layer, a first organic layer, a second inorganic layer, a second organic layer, and a third inorganic layer stacked in turn.

The present invention also provides a flexible organic light-emitting diode (OLED) display panel, comprising: a flexible substrate; a plurality of OLED devices disposed on the flexible substrate; and a thin-film encapsulating layer disposed on a surface of the OLED devices; wherein the thin-film encapsulating layer includes at least two separate thin-film encapsulating units, the at least two thin-film encapsulating units cover the surface of the OLED devices opposite to the flexible substrate in a form of an one-dimensional array or a two-dimensional array, and a gap is formed between edges of two of the thin-film encapsulating unit adjacent to each other.

According to a preferred embodiment of the present invention, the flexible OLED display panel comprises a display region and a non-display region surrounding the display region; and the thin-film encapsulating layer covers a portion of the OLED devices corresponding to the display region.

According to a preferred embodiment of the present invention, the thin-film encapsulating layer further covers a portion of the OLED devices corresponding to the non-display region.

According to a preferred embodiment of the present invention, the thin-film encapsulating layer is integrally connected with the portion of the OLED devices corresponding to the non-display region.

According to a preferred embodiment of the present invention, the display panel further comprises a polymer layer adhered to a surface of the thin-film encapsulating layer.

According to a preferred embodiment of the present invention, the polymer layer is made of acrylate, fluorine-containing acrylate or acrylamide.

According to a preferred embodiment of the present invention, the at least two thin-film encapsulating units forms at least one first row of the thin-film encapsulating units and at least one second row of the thin-film encapsulating units, the first row of the thin-film encapsulating units is adjacent to the second row of the thin-film encapsulating units, and the arrangement of the thin-film encapsulating units in the first row of the thin-film encapsulating units and thin-film encapsulating units in the second row of the thin-film encapsulating units are alternately arranged in a staggered manner.

According to a preferred embodiment of the present invention, the display panel further comprises a plurality of spacers, the OLED devices adjacent to each other are separated from each other by the spacers, and the gap formed between two of the thin-film encapsulating units adjacent to each other is located at a region of the spacer.

According to a preferred embodiment of the present invention, the OLED devices comprises an anode metal layer, a hole transport layer, an organic light emitting layer, an electron transport layer, and a cathode metal layer stacked in turn, and the cathode metal layer on the surface of the OLED devices is adhered to and covered with a surface of the thin-film encapsulating units.

According to a preferred embodiment of the present invention, the thin-film encapsulating units include a first inorganic layer, a first organic layer, a second inorganic layer, a second organic layer, and a third inorganic layer stacked in turn.

Compared to the existing flexible OLED display panels, the present invention has the advantages: the flexible OLED display panel according to the present invention, is designed as an entire layer of thin-film encapsulating structure into an encapsulating structure composed by a number of independent thin-film encapsulating units, these thin-film encapsulating units are composed by an integer multiple of in-plane OLED devices, these thin-film encapsulating units are finally uniformly distributed. The structure may be implemented by vapor deposition through an elaborate metal mask plate. Compared to the entire layer of the encapsulation structure, the present invention may disperse the mechanical stress generated during bending, thus increasing the flexibility and bendability of the flexible OLED, and avoiding the cracks which occur in a moisture and oxygen barrier material layer of a flexible OLED display panel thereby ensuring the properties of a barrier against moisture and oxygen, resulting in enhancing the reliability of the flexible OLED.

BRIEF DESCRIPTION OF THE SEVERAL VIEWS OF THE DRAWINGS

In order to more clearly illustrate the technical solutions in the embodiments or the prior art embodiment of the present invention, the accompanying drawings, briefly described embodiments, or the prior art need to be used in describing the embodiments. The drawings and the following description are only some embodiments of the present disclosure. Those of ordinary skill in the art may, without creative efforts, derive from these drawings other drawings.

DESCRIPTION OF SPECIFIC EMBODIMENTS OF THE INVENTION

The structure and the technical means adopted by the present invention to achieve the above and other objects may be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

The present invention is directed against a conventional flexible OLED display panel, which solves problems of conventional flexible OLED display panels. Conventional technology of the flexible OLED display panel uses an entire organic layer and inorganic layer to compose a thin film encapsulation layer for encapsulation. Since the flexibility of the inorganic layer is lower, it will not beneficial to dispersion of mechanical stress. The risk of cracks is prone to occur during curling, folding, or bending for an extended time, resulting in moisture and oxygen entering into the devices through the cracks, causing the OLED display panel to malfunction. The embodiments according to the present invention are capable of solving the drawbacks described herein.

Figure 1:
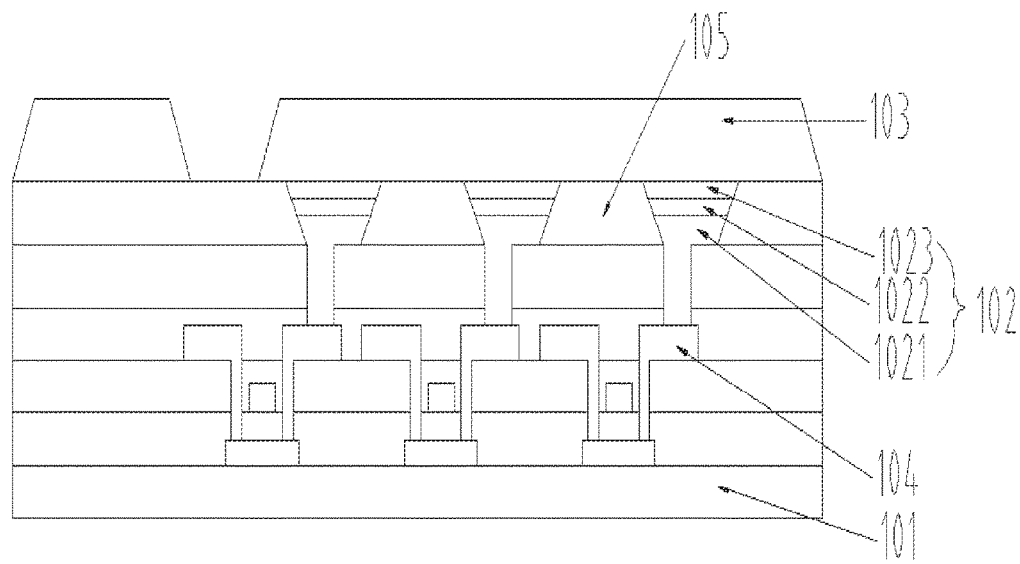
FIG. 1 is a schematic cross-sectional view of a flexible OLED display panel according to the present invention.

Referring to FIG. 1, a schematic cross-sectional view of an embodiment of a structure of a flexible OLED display panel according to the present invention is provided. A flexible OLED display panel includes a flexible substrate 101, a plurality of OLED devices 102, and a thin-film encapsulating layer, wherein the flexible substrate 101 is a substrate made of flexible material for carrying the OLED devices 102, and the OLED devices 102 are disposed on the flexible substrate 101. The OLED devices 102 include an anode metal layer 1021 disposed on the flexible substrate 101, a hole transport layer disposed on the anode metal layer 1021, an organic light emitting layer 1022 disposed on the hole transport layer, an electron transport layer disposed on the organic light emitting layer 1022, and a cathode metal layer 1023 disposed on the electron transport layer. The thin-film encapsulating layer covers and encapsulates the cathode metal layer 1023 which is disposed on a surface of the OLED devices 102. The thin-film encapsulating layer includes at least two separate thin-film encapsulating units 103, the at least two thin-film encapsulating units 103 cover the surface of the OLED devices 102 opposite to the flexible substrate 101 in a form of an one-dimensional array or a two-dimensional array. A gap is formed between edges of two of the thin-film encapsulating units 103 adjacent to each other, the direction of the gap is perpendicular to a bending direction of the flexible OLED display panel A thin film transistor array is formed on a corresponding region where is on the flexible substrate 101 corresponding to the OLED devices 102, and each of anode metal plates of the anode metal layer 1021 are connected to the respective thin film transistors 104 in the thin film transistor array. The thin film transistor array may be formed by patterning process, specifically, forming the thin film transistor array in the corresponding region where is on the flexible substrate 101 corresponding to the OLED devices 102 by photolithography and etching methods, the thin film transistor array is for driving the OLED devices 102, the types of the thin film transistors 104 are not limited, and may be amorphous silicon thin film transistors, polysilicon thin film transistors, oxide thin film transistors, or organic thin film transistors. The manufacturing of the OLED devices 102 is not particularly limited in this embodiment, thus the manufacturing methods of the OLED devices 102 will not be repeated, types of OLED devices 102 may be top-emitting or double-side-emitting, and the luminous color may be monochrome, color or white.

The flexible OLED display panel further includes a plurality of spacers 105 disposed on a surface of the flexible substrate 101 to function as isolating different pixels, and a gap is formed between edges of two of the thin-film encapsulating units 103 adjacent to each other, the gap is located in the region corresponding to the spacers 105. Each of the spacers 105 is kept at a uniform height and has good integrity so that the film encapsulating units 103 covering a surface of the spacers may be compactly adhered, to prevent water and oxygen from entering into the devices through the gap. Each height of the spacers 105 is consistent, to ensure that when the flexible OLED display panel in bending, the stress of the thin-film encapsulating units 103 which are adhered the spacers 105 is uniform, thereby improving the stability of the flexible OLED display panel. Since the spacers 105 are flexible, when the flexible OLED display panel in bending, cracks do not easily occurred at the gap formed between two of the thin-film encapsulating units 103.

The materials of the thin-film encapsulating layer include a first inorganic layer, a first organic layer, a second inorganic layer, a second organic layer, and a third inorganic layer stacked in turn. The thin-film encapsulating layer may be a plurality of composite coatings. The materials of the first inorganic layer, the second inorganic layer, and the third inorganic layer may be inorganic material such as silicon nitride, silicon oxide or aluminum oxide, etc. The materials of the first organic layer and second organic layer may be organic material such as epoxy, etc. The materials of the substrate may be such as polyimide, polyethylene terephthalate, high molecular weight polyethylene, olefin polymer, etc. The materials described above are not specifically limited and may be purchased through the market.

Figure 2A:
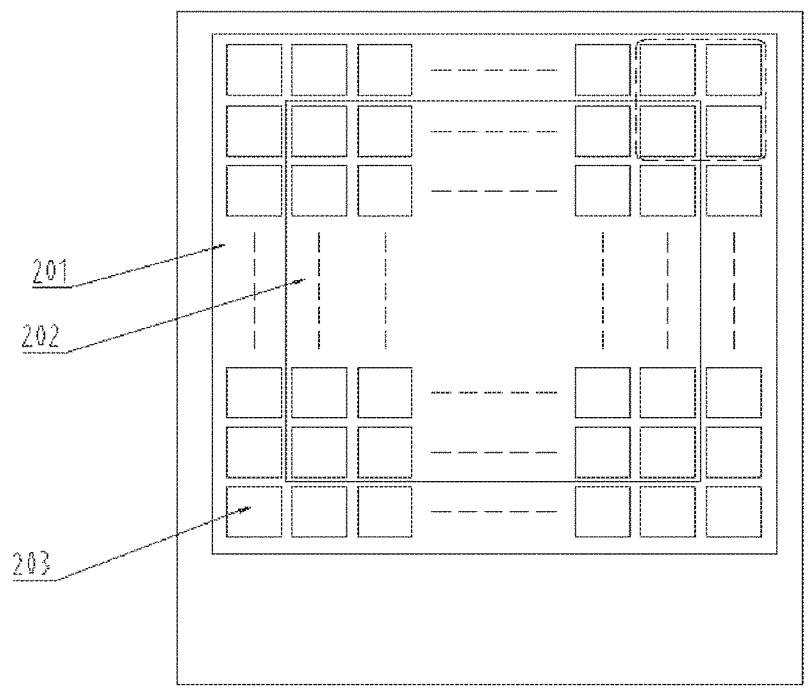
FIG. 2a is a schematic view of the structure of a thin-film encapsulation layer of a flexible OLED display panel according to the present invention.

As shown in FIG. 2a, a schematic cross-sectional view of another embodiment of a structure of a flexible OLED display panel according to the present invention is provided, the display panel includes a display region and a non-display region. In order to achieve a better effect of sealing and protecting, a portion of an encapsulation region is added on the periphery of the display region, the portion of the encapsulation area is non-display region 201, so that the encapsulation area includes a display region 202 and a non-display region 201, both of the non-display region 201 and the display region 202 are encapsulated by a plurality of thin-film encapsulating units 203. A gap is formed between two of the thin-film encapsulating units 203 adjacent to each other. In the display region 202, the thin-film encapsulating units 203 covers a portion of a plurality of OLED devices corresponding to the display region 202, and in the non-display region 201, the thin-film encapsulating units 203 are distributed in the same manner as in the display region 202, and the thin-film encapsulating units 203 also cover a portion of the OLED devices corresponding to the non-display region.

An area of one of the thin-film encapsulating units 203 is an integer multiple of an area of one of the OLED devices, which may cover one of the OLED devices or more than one of the OLED devices, the number of the thin-film encapsulating units 203 is determined by the actual demand of the design, finally uniform distribution. Preferably, the shape and the distribution of the thin-film encapsulating units 203 of the non-display region 201 remains the same as that of the display region 202. If the special packaging requirements may also be designed based on the actual situation to ensure that the encapsulation effect of the non-display region 201. Finally, using the elaborate metal mask plate for vapor deposition can achieve the design structure.

Figure 2B:
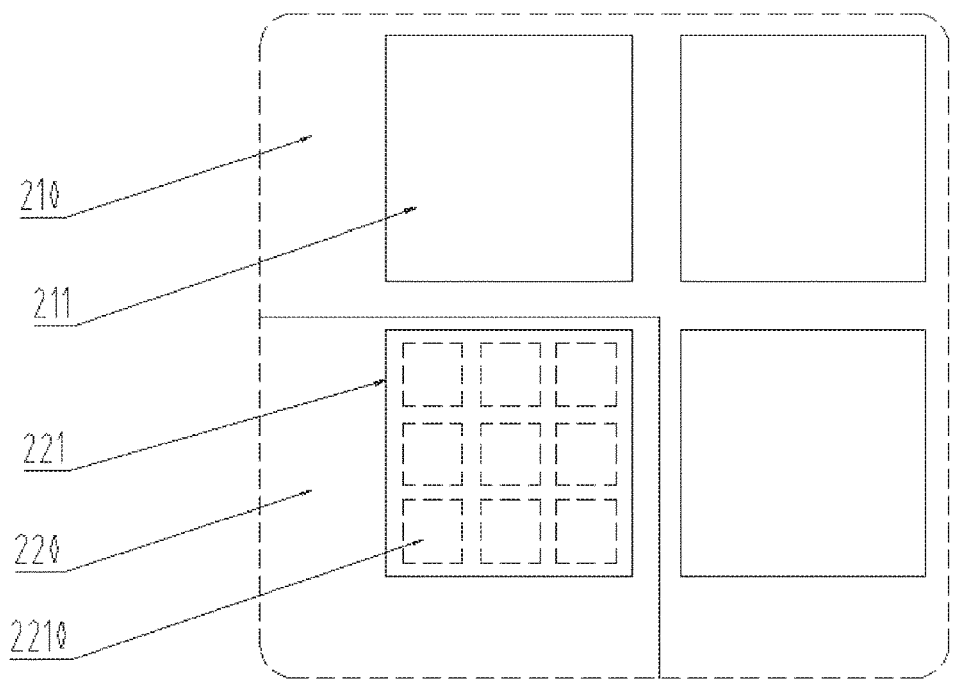
FIG. 2b is a schematic view of a partially enlarged structure of a thin-film encapsulation layer of a flexible OLED display panel according to the present invention.

As shown in FIG. 2b, the package area includes a non-display region 210 and a display region 220, the non-display region 210 includes a plurality of thin-film encapsulating units 211, the display region 220 includes a plurality of film encapsulating units 221 uniformly distributed. An area of one of the thin-film encapsulating units 221 is an integer multiple of an area of one of the OLED devices 2210, and the combination of the OLED devices 2210 is completely covered by the thin-film encapsulating units 221.

Another embodiment of a structure of a thin-film encapsulating layer of a flexible OLED display panel according to the present invention is provided in below. A plurality of thin-film encapsulating units in a display region are arranged in a form of an array on a surface of a plurality of OLED devices, a thin-film encapsulating layer formed by the thin-film encapsulating units is integrally connected with a portion of the OLED devices corresponding to the non-display region.

Figure 2C:
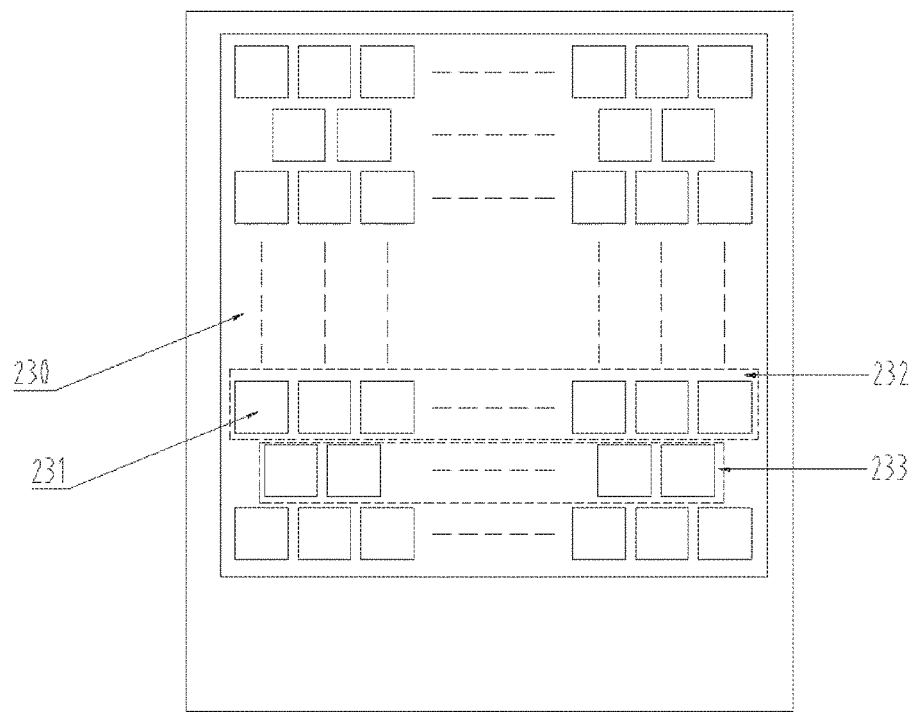
FIG. 2c is a schematic view of the structure of another thin-film encapsulation layer of a flexible OLED display panel according to the present invention.

As shown in FIG. 2c, another embodiment of a structure of a thin-film encapsulating layer of a flexible OLED display panel according to the present invention is provided in below. The distribution of each of the thin-film encapsulating units in the display region 230 and the non-display region is kept the same, at least two thin-film encapsulating units 231 constitute at least a first row 232 of the thin-film encapsulating units and at least a second row 233 of the thin-film encapsulating units. The first row 232 of the thin-film encapsulating units is adjacent to the second row 233 of the thin-film encapsulating units, and the thin-film encapsulating units in the first row 232 of the thin-film encapsulating units and the thin-film encapsulating units in the second row 233 of the thin-film encapsulating units are alternately arranged in a staggered manner.

A plurality of gaps between the thin-film encapsulating units 231 are alternately arranged in a staggered manner in a bending direction of the display panel. An interval distance between two of the gaps adjacent to each other is a length or width of one of the thin-film encapsulating units 231. This kind of distribution disperses the stress at the gaps between the thin-film encapsulating units 231 when the flexible OLED display panel is bent, so that cracks do not easily occur in the gaps, or larger cracks will not occur. The specific distribution of each of the thin-film encapsulating units may change depending on the actual conditions, the present invention is not limited thereto.

Another embodiment of a structure of a thin-film encapsulating layer of a flexible OLED display panel according to the present invention is provided, the display panel further includes a polymer layer adhered to a surface of the thin-film encapsulating layer. Material of the polymer layer is acrylate, fluorine-containing acrylate, acrylamide or a combination thereof. The polymer material can further ensure the reliability of the flexible OLED display panel without influencing the flexibility.

Figure 3A:
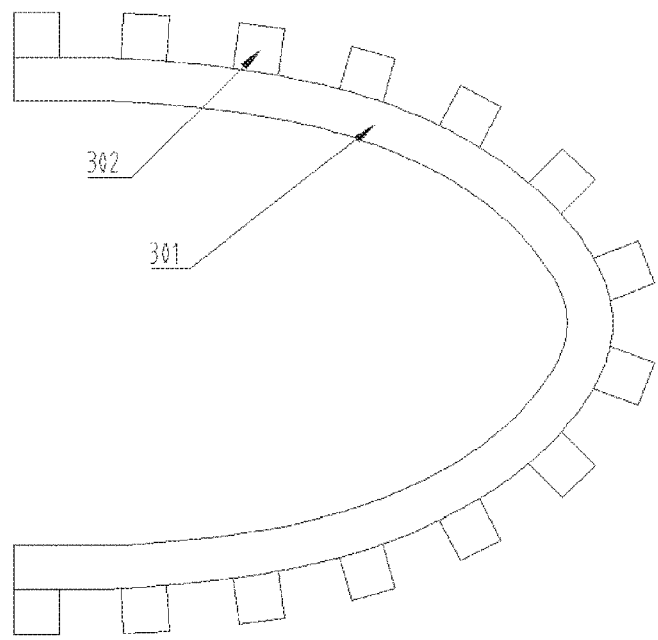
FIG. 3a is a schematic view of the stress when outward bending a flexible OLED display panel according to the present invention.

As shown in FIG. 3a illustrates a schematic view of the stress when bending a flexible OLED display panel outward according to an embodiment of the present invention. When the flexible OLED display panel is bent outwardly, one side of the flexible OLED display panel close to the substrate 301 bears a compressive stress, the other side of flexible OLED display panel close to thin-film encapsulated unit 302 bears a tensile stress, and the term "neutral layer" refers to a middle plane of the side that bears a tensile stress or a compressive stress, which neither bears a tensile stress nor a compressive stress, the tensile stress or the compressive stress is growing by distance on both sides of this layer, and when such stress exceeds that which the flexible OLED display panel can bear, at least one crack is generated, resulting in moisture and oxygen entering into the OLED devices through the crack, causing the malfunction of the OLED devices, thus the flexible OLED display panel needs to have better bending mechanical properties.

During the bending of the flexible OLED display panel, the greatest stress peak is in the region where the bending angle is minimized, which causes the fatigue due to the stress concentration effect from being bent over a long period of time, and then causes cracks or even breaks. The thin-film encapsulating layer described in the present invention is encapsulated in a combination of separate thin-film encapsulated units 302, the thin-film encapsulated units are uniformly distributed on a surface of the OLED devices, and thus equalize the stress peak at a region of rigid constraint. That is, the stress peak of the maximum bending area can be as equalized as possible, thereby dispersing the stress concentrated in the region to improve the fatigue caused by stress concentration effect. The peak value of the stress in a region with the smallest bending angle is equalized to the peak value of the stress around the region, such that the stress of the region is dispersed.

Figure 3B:
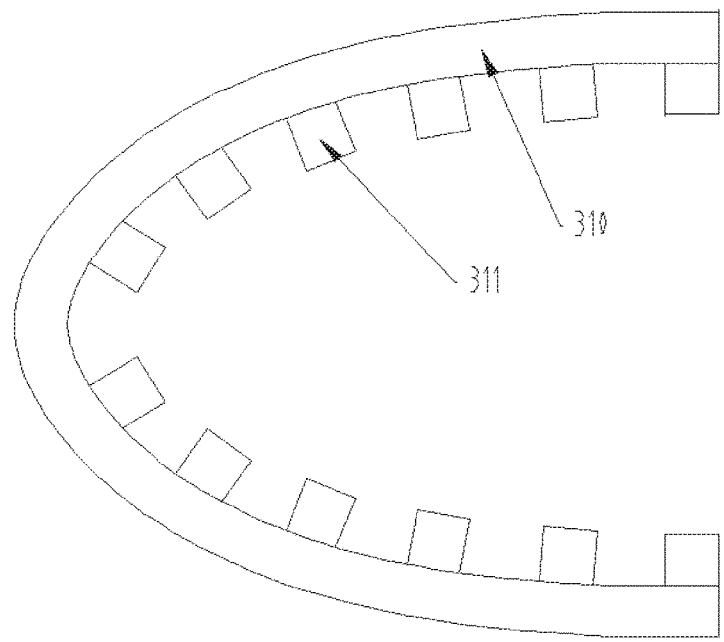
FIG. 3b is a schematic view of the stress when inward bending a flexible OLED display panel according to the present invention.

FIG. 3b illustrates a schematic view of the stress when bending a flexible OLED display panel inwardly according to an embodiment of the present invention. When the flexible OLED display panel is bent inwardly, one side of the flexible OLED display panel close to a thin-film encapsulated unit 311 bears a compressive stress, the other side of the flexible OLED display panel close to a substrate 310 bears a tensile stress, and the peak value of the stress in a region with the smallest bending angle is equalized to the peak value of the stress around the region, such that the stress of the region is dispersed. The principle of stress dispersion is the same as that shown in FIG. 3a, and is not repeated here.

A method for encapsulating a flexible OLED display panel comprises the steps of:

Step S1: forming a thin film transistor array on a flexible substrate corresponding to a region of a plurality of OLED devices, forming the OLED devices over the thin film transistor array;

Step S2: vapor depositing a first inorganic layer, a first organic layer, a second inorganic layer, a second organic layer, and a third inorganic layer stacked in turn to compose a combination of a thin-film encapsulating layer on the OLED device corresponding to an area where the flexible OLED display panel is to be encapsulated through an elaborate metal mask plate.

The number of film layers to compose the thin-film encapsulating layer and the manufacturing method thereof may be decided according to the actual situation, and not limited thereto.

Compared to the conventional technologies, the flexible OLED display panel according to the present invention is designed the separate thin-film encapsulating units from each other in a form of a combination of a thin-film encapsulating layer, rather than an entire thin-film encapsulating layer, which may disperse the mechanical stress generated during bending, thus increasing the flexibility and bendability of the OLED display panel, and therefor indirectly ensure the properties of a barrier against moisture and oxygen, and thereby enhance the reliability of the flexible OLED display panel.

In view of the above, although the present invention has been disclosed by way of preferred embodiments, the above-described preferred embodiments are not intended to limit the present invention, and one of ordinary skill in the art will, without departing from the spirit and scope of the invention, the scope of protection of the present invention is defined by the scope of the claims.

What is claimed is:

1. A flexible organic light-emitting diode (OLED) display panel, comprising:
    a flexible substrate;
    a plurality of OLED devices disposed on the flexible substrate; and
    a thin-film encapsulating layer disposed on a surface of the OLED devices;
    wherein the thin-film encapsulating layer includes at least two separate thin-film encapsulating units, the at least two thin-film encapsulating units cover the surface of the OLED devices opposite to the flexible substrate in a form of an one-dimensional array or a two-dimensional array, a gap is defined between edges of two of the thin-film encapsulating units adjacent to each other, and an extension direction of the gap is perpendicular to a bending direction of the flexible OLED display panel, wherein the flexible OLED display panel comprises a display region and a non-display region surrounding the display region; and the thin-film encapsulating layer covers a portion of the OLED devices corresponding to the display region; and wherein the at least two thin-film encapsulating units form at least one first row of the thin-film encapsulating units and at least one second row of the thin-film encapsulating units, the first row of the thin-film encapsulating units is adjacent to the second row of the thin-film encapsulating units, and the thin-film encapsulating units in the first row of the thin-film encapsulating units and the thin-film encapsulating units in the second row of the thin-film encapsulating units are alternately arranged in a staggered manner.

2. The flexible OLED display panel according to claim 1, wherein the thin-film encapsulating layer further covers a portion of the OLED devices corresponding to the non-display region.

3. The flexible OLED display panel according to claim 2, wherein the thin-film encapsulating layer is integrally connected with the portion of the OLED devices corresponding to the non-display region.

4. The flexible OLED display panel according to claim 1, wherein the display panel further comprises a polymer layer adhered to a surface of the thin-film encapsulating layer.

5. The flexible OLED display panel according to claim 4, wherein the polymer layer is made of acrylate, fluorine-containing acrylate, or acrylamide.

6. The flexible OLED display panel according to claim 1, wherein the display panel further comprises a plurality of spacers, the OLED devices adjacent to each other are separated from each other by the spacers, and the gap formed between two of the thin-film encapsulating units adjacent to each other is located at a region of the spacer.

7. The flexible OLED display panel according to claim 1, wherein the OLED devices comprises an anode metal layer, a hole transport layer, an organic light emitting layer, an electron transport layer, and a cathode metal layer stacked in turn, and the cathode metal layer on the surface of the OLED devices is adhered to and covered with a surface of the thin-film encapsulating units.

8. The flexible OLED display panel according to claim 7, wherein the thin-film encapsulating units include a first inorganic layer, a first organic layer, a second inorganic layer, a second organic layer, and a third inorganic layer stacked in turn.

9. A flexible organic light-emitting diode (OLED) display panel, comprising:
 a flexible substrate;
 a plurality of OLED devices disposed on the flexible substrate; and
 a thin-film encapsulating layer disposed on a surface of the OLED devices;
 wherein the thin-film encapsulating layer includes at least two separate thin-film encapsulating units, the at least two thin-film encapsulating units cover the surface of the OLED devices opposite to the flexible substrate in a form of an one-dimensional array or a two-dimensional array, and a gap is formed between edges of two of the thin-film encapsulating unit adjacent to each other,
 wherein the flexible OLED display panel comprises a display region and a non-display region surrounding the display region; and the thin-film encapsulating layer covers a portion of the OLED devices corresponding to the display region; and
 wherein the at least two thin-film encapsulating units forms at least one first row of the thin-film encapsulating units and at least one second row of the thin-film encapsulating units, the first row of the thin-film encapsulating units is adjacent to the second row of the thin-film encapsulating units, and the arrangement of the thin-film encapsulating units in the first row of the thin-film encapsulating units and thin-film encapsulating units in the second row of the thin-film encapsulating units are alternately arranged in a staggered manner.

10. The flexible OLED display panel according to claim 9, wherein the thin-film encapsulating layer further covers a portion of the OLED devices corresponding to the non-display region.

11. The flexible OLED display panel according to claim 10, wherein the thin-film encapsulating layer is integrally connected with the portion of the OLED devices corresponding to the non-display region.

12. The flexible OLED display panel according to claim 9, wherein the display panel further comprises a polymer layer adhered to a surface of the thin-film encapsulating layer.

13. The flexible OLED display panel according to claim 12, wherein the polymer layer is made of acrylate, fluorine-containing acrylate, or acrylamide.

14. The flexible OLED display panel according to claim 9, wherein the display panel further comprises a plurality of spacers, the OLED devices adjacent to each other are separated from each other by the spacers, and the gap formed between two of the thin-film encapsulating units adjacent to each other is located at a region of the spacer.

15. The flexible OLED display panel according to claim 9, wherein the OLED devices comprises an anode metal layer, a hole transport layer, an organic light emitting layer, an electron transport layer, and a cathode metal layer stacked in turn, and the cathode metal layer on the surface of the OLED devices is adhered to and covered with a surface of the thin-film encapsulating units.

16. The flexible OLED display panel according to claim 15, wherein the thin-film encapsulating units include a first inorganic layer, a first organic layer, a second inorganic layer, a second organic layer, and a third inorganic layer stacked in turn.

* * * * *